(12) United States Patent  
Cheng et al.

(10) Patent No.: US 9,419,019 B2  
(45) Date of Patent: Aug. 16, 2016

(54) ARRAY SUBSTRATE AND DISPLAY DEVICE

(71) Applicant: BOE TECHNOLOGY GROUP CO., LTD, Beijing (CN)

(72) Inventors: Hongfei Cheng, Beijing (CN); Yong Qiao, Bejing (CN); Jianbo Xian, Beijing (CN); Wenbo Li, Beijing (CN); Pan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/482,686

(22) Filed: Sep. 10, 2014

(65) Prior Publication Data

US 2015/0364500 A1 Dec. 17, 2015

(30) Foreign Application Priority Data

Jun. 12, 2014 (CN) .................. 2014 2 0312931 U

(51) Int. Cl.  
*H01L 21/28* (2006.01)  
*H01L 27/12* (2006.01)

(52) U.S. Cl.  
CPC .................................. *H01L 27/1222* (2013.01)

(58) Field of Classification Search  
CPC ............... H01L 21/0217; H01L 21/28; H01L 21/31111; H01L 21/768; H01L 27/124; H01L 27/127; H01L 27/12; H01L 27/1225; H01L 27/1262; H01L 27/322; H01L 27/3276  
See application file for complete search history.

(56) References Cited

U.S. PATENT DOCUMENTS

| | | | | |
|---|---|---|---|---|
| 2005/0110924 A1* | 5/2005 | Kim | ...................... | G02F 1/1393 349/111 |
| 2008/0239187 A1* | 10/2008 | Yang | .................. | G02F 1/136209 349/44 |
| 2009/0207366 A1* | 8/2009 | Kim | .................. | G02F 1/134363 349/147 |

* cited by examiner

*Primary Examiner* — Kyoung Lee  
(74) *Attorney, Agent, or Firm* — Kinney & Lange, P.A.

(57) ABSTRACT

An array substrate and a display device is disclosed, for eliminating the interference of transient electromagnetic signals caused by the time-varying voltages on the gate lines and the data lines with the voltages on the pixel electrodes. The array substrate comprises gate lines and data lines disposed on a substrate, and pixel units surrounded and separated by the gate lines and the data lines; and the array substrate further comprises shielding electrodes disposed above at least one of the gate lines and the data lines to cover at least part of the at least one and electrically insulated from the gate lines and the data lines.

10 Claims, 3 Drawing Sheets

ARRAY SUBSTRATE AND DISPLAY DEVICE

CROSS-REFERENCE TO RELATED APPLICATION

This application claims the benefit of Chinese Patent Application No. 201420312931.0 filed on Jun. 12, 2014 in the State Intellectual Property Office of China, the whole disclosure of which is incorporated herein by reference.

BACKGROUND OF THE INVENTION

1. Field of the Invention

The embodiments of the present invention relate to a field of display technology, and more particularly, relate to an array substrate and a display device.

2. Description of the Related Art

With rapid development of display technology, high image quality display is an objective ceaselessly pursued by manufacturers.

In the field of liquid crystal display technology and the field of organic light emitting display technology, a display device generally comprises a substrate provided with a pixel array thereon, and the pixel array comprising pixels arranged in a matrix, and gate lines and data lines arranged in rows and columns.

Since voltage signals applied to the gate lines and the data lines are alternating voltage signals, that is, the voltage signals on the gate lines and the data lines continuously change over time, which causes transient electromagnetic signals that will interfere with voltages on pixel electrodes in the pixel units, thereby deteriorating image display quality.

SUMMARY OF THE INVENTION

Embodiments of the present invention provide an array substrate and a display device, which can eliminate the interference of transient electromagnetic signals on the voltages on the pixel electrodes, the transient electromagnetic signals being caused by the time-varying voltages on the gate lines and the data lines.

In one aspect of the present invention, there is provided an array substrate, comprising: gate lines and data lines disposed on a substrate; pixel units surrounded and separated by the gate lines and the data lines; and shielding electrodes, the shielding electrodes being disposed above at least one of the gate lines and the data lines to cover at least part of the at least one of the gate lines and the data lines, and being electrically insulated from the gate lines and the data lines.

In another aspect of the present invention, there is provided a display device comprising the array substrate as described above.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS OF THE INVENTION

Figure 1:
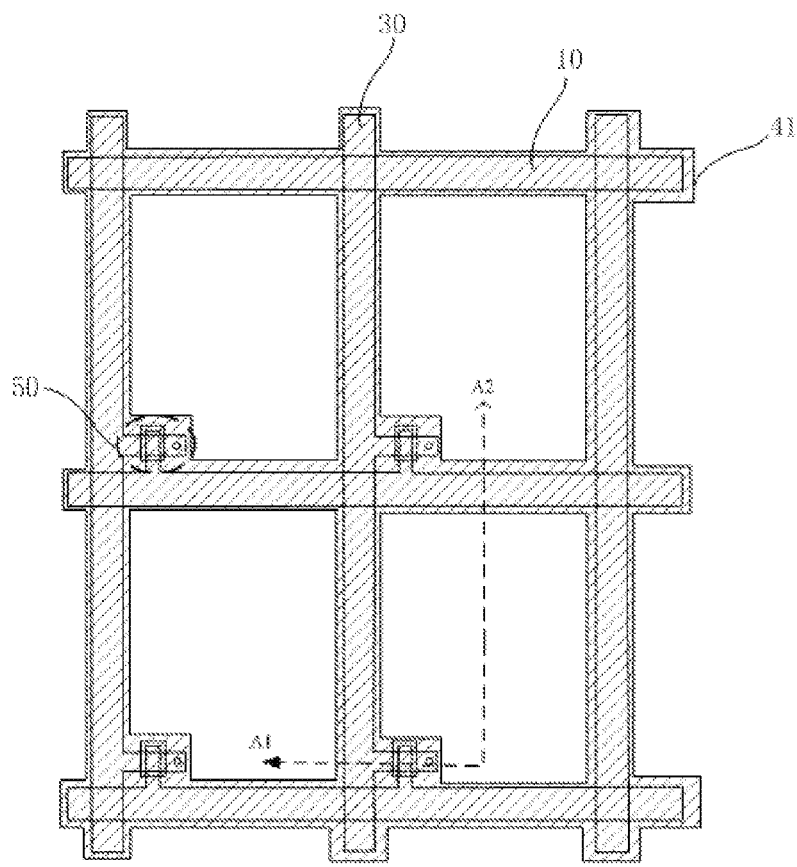
FIG. 1 is a schematic top view showing an array substrate according to an embodiment of the present invention.

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Embodiments of the present invention provide an array substrate and a display device for eliminating interference of transient electromagnetic signals caused by time-varying voltages on gate lines and data lines with voltages on pixel electrodes.

The array substrate according to embodiments of the present invention is applicable in the field of liquid crystal display technology and the field of organic light emitting display technology, for example, can be applied to display devices of various modes such as Twisted Nematic (TN) type, Advanced Super-Dimension Switching (ADS) type, In Plane Switching (IPS) type, Vertically Aligned-In Plane Switching (VA-IPS) type, or the like.

Embodiments of the present invention will be described in detail below with reference to FIGS. 1 and 2 by using a NT mode display device as an example.

The NT mode display device comprises a color substrate provided with common electrodes thereon and an array substrate provided with pixel electrodes thereon.

Figure 2:
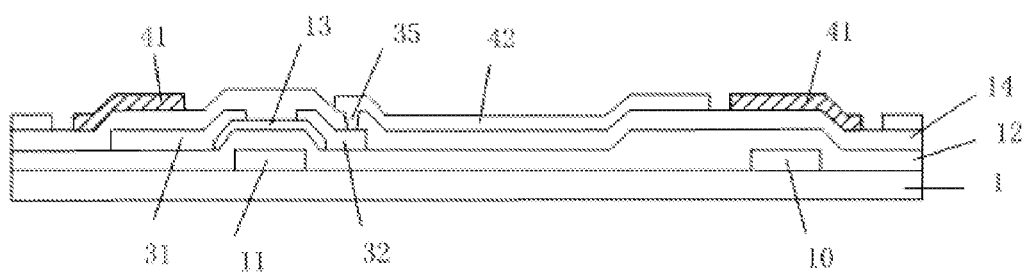
FIG. 2 is a schematic sectional view taken along a line A1-A2 in FIG. 1.

FIG. 1 is a schematic top view showing an array substrate according to an embodiment of the present invention, and FIG. 2 is a schematic sectional view taken along a line A1-A2 in FIG. 1.

The array substrate comprises gate lines 10 and data lines 30 disposed on a substrate 1, and pixel units (not shown in FIGS. 1 and 2) surrounded and separated by the gate lines 10 and the data lines 30.

The array substrate further comprises shielding electrodes 41, which are disposed above at least one of the gate lines 10 and the data lines 30 and electrically insulated from the gate lines 10 and the data lines 30, and the shielding electrodes 41 covering the all or part of gate lines 10 and/or data lines 30.

As long as the shielding electrodes 41 are electrically insulated from the gate lines 10 and the data lines 30 and cover all or part of the gate lines 10 and/or the data lines 30, the positions of the shielding electrodes 41 are not limited.

The manners by which the shielding electrodes 41 cover the gate lines 10 and/or the data lines 30 are not limited, and the shielding electrodes 41 may cover the gate lines 10 and/or the data lines 30 in at least following ways:

In a first way, the shielding electrodes 41 only cover parts or all of the gate lines 10;

In a second way, the shielding electrodes 41 only cover parts or all of the data lines 30;

In a third way, the shielding electrodes 41 cover parts or all of the gate lines 10, and cover parts or all of the data lines 30.

The third way can be implemented in following four manners: the shielding electrodes 41 cover part of the gate lines 10 and all of the data lines 30; the shielding electrodes 41 cover all of the gate lines 10 and part of the data lines 30; the shielding electrodes 41 cover part of the gate lines 10 and part of the data lines 30; and the shielding electrodes 41 cover all of the gate lines 10 and all of the data lines 30.

In an alternative embodiment of the present invention, the shielding electrodes 41 are disposed above the gate lines 10 and cover all of the gate lines 10; in an alternative embodiment of the present invention, the shielding electrodes 41 are disposed above the data lines 30 and cover all of the data lines 30; in an alternative embodiment of the present invention, the shielding electrodes 41 are disposed above the gate lines 10 and the data lines 30, and cover all of the gate lines 10 and all of the data lines 30.

According to embodiments of the present invention, voltage signals, which are applied to the gate lines and the data lines and vary over time, can be shielded, thereby, the pixel electrodes can be prevented from being interfered by the transient electromagnetic signals caused by the varying voltage signals on the gate lines and the data lines. Of course, other functional structures, such as a black matrix having magnetic property or electrically conductive particles, or touch functional structure of the display device including the array substrate, can also be prevented from being affected by the varying voltage signals on the gate lines and the data lines. Since the gate lines and the data lines are arranged closer to the pixel electrodes relative to other structures, interferences on the pixel electrodes are larger.

Even when the shielding electrodes cover only part of at least one of the gate lines and the data lines, the pixel electrodes can be prevented from being interfered by the transient electromagnetic signals caused by the varying voltage signals on the gate lines and the data lines.

In the array substrate shown in FIG. 1, the shielding electrodes 41 cover all of the gate lines 10 and all of the data lines 30.

As shown in FIG. 1, thin film transistors (TFT) 50 are arranged near the crossed regions between the gate lines and the data lines, and have gates connected with the gate lines, sources connected with the data lines and drains connected with the pixel electrodes. In the example shown in FIG. 1, the shielding electrodes 41 are not only disposed above the gate lines 10 and/or the data lines 30, but also disposed above the thin film transistors (TFTs) 50, that is, the shielding electrodes 41 further comprise portions covering the TFTs 50. This is because transient electromagnetic signals will also be generated between data signals on the data lines and gate on-off signals on the gate lines and pixel electrodes when these signals pass through the TFTs, and thus interference with voltage on the pixel electrodes is introduced.

As shown in FIG. 2, on the substrate 1 are provided the gate lines 10 and gates 11, a gate insulation layer 12 above the gate lines 10 and the gates 11, an active layer 13, sources 31 and drains 32 above the gate insulation layer 12; a passivation layer 14 above the sources 31 and the drains 32, and the shielding electrodes 41 and the pixel electrodes 42 above the passivation layer 14.

The shielding electrodes 41 comprise portions disposed directly above the gate lines 10, and portions disposed directly above the sources 31 and the data lines (not shown in FIG. 2). Alternatively, the shielding electrodes 41 fully cover the gate lines 10 and/or the data lines.

Although the array substrate shown in FIG. 2 has been described by taking top-gate type TFTs for an example, the TFTs of the present invention are not limited to the top-gate type TFTs, and may be of any TFT configurations applicable in display field, such as bottom-gate type TFTs or double gate type TFTs.

In the array substrate shown in FIG. 2, the pixel electrodes 42 and the drains 32 are located in different layers, and thus are connected with each other by first via holes 35 respectively.

Voltages on the shielding electrodes are constant voltages, and may be supplied from an external power supply. In order to simplify circuit configuration and avoid the influence of the external power supply on designs of other circuits or electrical signals, according to an embodiment of the present invention, the following solution is provided.

The array substrate shown in FIG. 1 further comprises common electrode lines disposed above the substrate. The common electrode lines and the pixel electrodes form storage capacitors.

Figure 3:
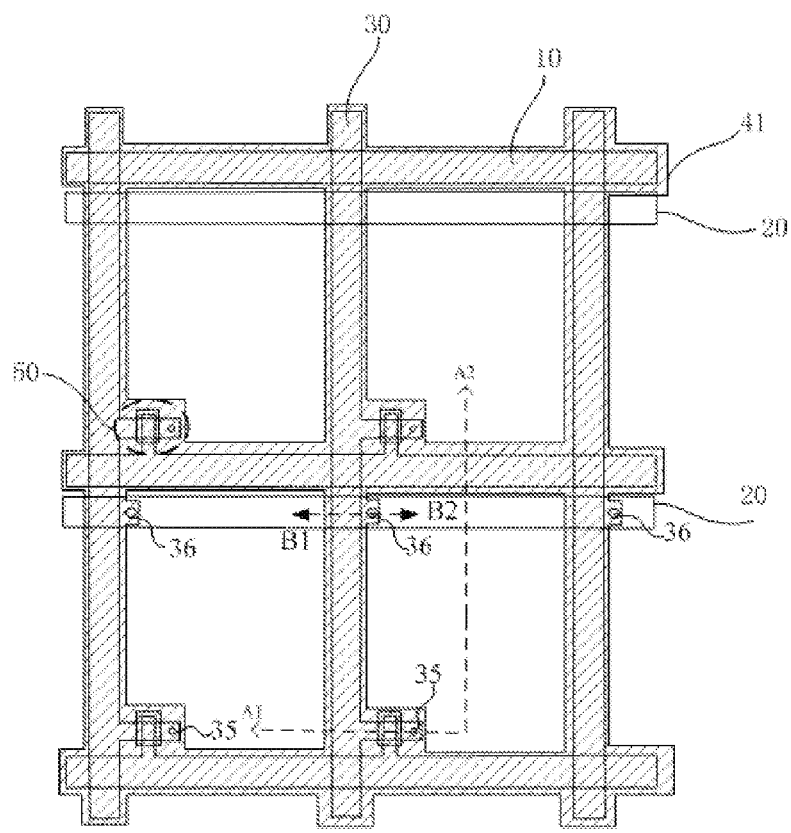
FIG. 3 is a schematic top view showing an array substrate comprising common electrode lines.

FIG. 3 is a schematic top view showing an array substrate comprising common electrode lines 20. According to an embodiment, the common electrode lines 20 are arranged in such a way that the common electrode lines 20 and gate lines 10 are parallel and near to each other. The common electrode lines 20 and gate lines 10 are kept to be electrically insulated from each other.

Figure 4:
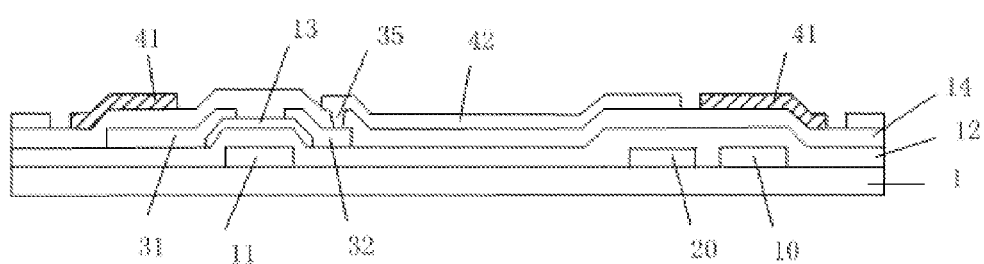
FIG. 4 is a schematic sectional view taken along a line A1-A2 in FIG. 3.

FIG. 4 is a sectional view taken along a line A1-A2 in FIG. 3. In the embodiment shown in FIG. 4, the common electrode lines 20 and the gate lines 10 are arranged in the same layer.

According to an embodiment of the present invention, the shielding electrodes 41 are at least partially overlapped with the common electrode lines 20 and/or the gate lines 10 in a direction perpendicular to the array substrate, thereby shielding inferences on the pixel electrodes by signals of the gate lines and the common electrode lines.

According to an embodiment of the present invention, the shielding electrodes 41 are electrically connected with the common electrode lines 20. Alternatively, the shielding electrodes 41 are connected with the common electrode lines 20 by via holes. As shown in FIG. 3, the shielding electrodes 41 are connected with the common electrode lines 20 by second via holes 36.

Figure 5:
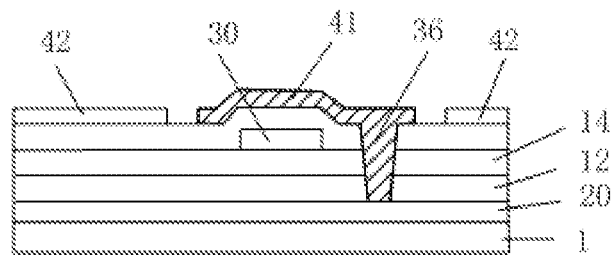
FIG. 5 is a sectional view taken along a line B1-B2 in FIG. 3.

FIG. 5 is a sectional view taken along a line B1-B2 in FIG. 3. FIG. 5 shows that the shielding electrodes 41 are connected with the common electrode lines 20 by second via holes 36.

Positions of second via holes 36 are not limited. As an example, one second via hole is provided for each pixel unit. Specifically, one second via hole is formed near each pixel electrode. Since the pixel electrodes are arranged in an array, in an embodiment of the present invention, the second via holes are provided at locations which are the same with respect to respective pixel electrodes, so that the second via holes also have an array arrangement on the array substrate.

As another example, one second via hole is provided for every two, three or more pixel electrodes. In an embodiment of the present invention, positions of the second via holes are arranged in an array on the array substrate.

As shown in FIGS. 2, 4 and 5, the pixel electrodes 42 are arranged on the array substrate, located in the same layer as the shielding electrodes 41, and electrically insulated from the shielding electrodes 41, thereby simplifying the structure of the entire array substrate.

Material for the shielding electrodes is not limited, and may be an electrically conductive layer of metal, alloy or metal oxide, or an electrically conductive transparent or opaque layer.

The pixel electrodes 42 and the shielding electrodes 41 may be made of the same material.

According to an embodiment, the pixel electrodes 42 and the shielding electrodes 41 are electrically conductive transparent electrodes of the same material such as Indium Tin Oxide (ITO), Silver Zinc Oxide (IZO), or the like.

Materials for manufacturing the gate lines, the common electrode lines and the data lines are not limited. According to an embodiment, the gate lines, the common electrode lines and the data lines may be made of metal or alloy.

For example, the gate lines, the common electrode lines and the data lines may be made from at least one of metal materials such as copper (Cu), aluminum (Al), molybdenum (Mo), titanium (Ti), chromium (Cr), tungsten (W) or the like.

The gate lines may be a single layer structure, or a multi-layer structure such as Mo\Al\Mo structure, Ti\Cu\Ti structure, Mo\Ti\Cu structure, or the like.

According to an embodiment of the present invention, the gate lines and the common electrode lines are located in the same layer; alternatively, the gate lines and the common electrode lines are made of the same material. In that way, the gate lines and the common electrode lines can be made by the same patterning process, thereby not only simplifying the structure of the array substrate, but also simplifying processes for manufacturing respective functional film layers.

Furthermore, all the gate lines, the data lines and the common electrode lines may be made of the same material.

In addition, material for manufacturing the gate insulation layer 12 shown in FIG. 4 or 5 is not limited, and alternatively, may be silicon nitride or silicon oxide; the structure of the gate insulation layer 12 is not limited, and alternatively, may be a single layer structure, or a multi-layer structure such as a double layer structure made of silicon oxide/silicon nitride.

Material for manufacturing the active layer 13 shown in FIG. 4 or 5 is not limited, for example, it may be amorphous silicon or oxide semiconductor material.

Material for manufacturing the passivation layers 14 shown in FIG. 4 or 5 is not limited, for example, it may be an inorganic material such as silicon nitride, or an organic material such as resin.

Figure 6:
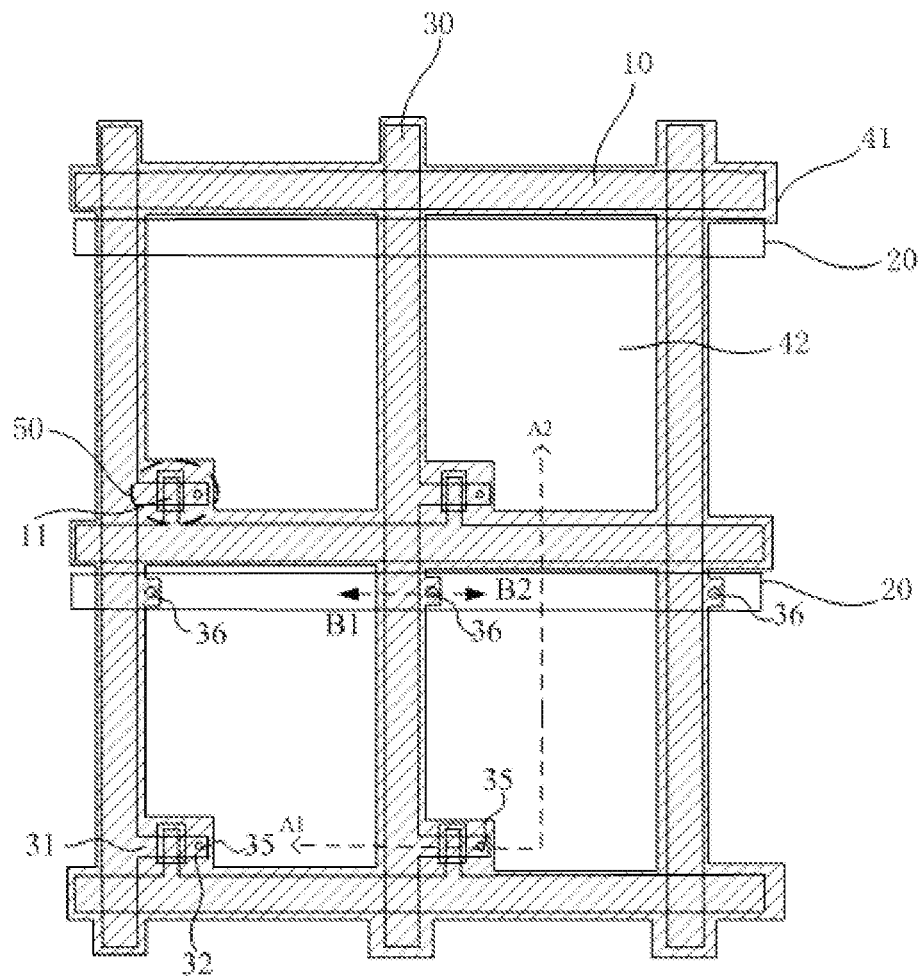
FIG. 6 is a schematic top view showing an array substrate comprising thin film transistors according to an embodiment of the present invention.

A method for manufacturing the array substrate according to an embodiment of the present invention will be briefly described below. Taking the array substrate shown in FIG. 6 for instance, the method for manufacturing the array substrate comprises following steps:

Step 1: first, an electrically conductive layer, for example, a metal layer such as Al, is deposited on a substrate by a sputtering process; then, the electrically conductive layer is coated with photoresist, and is exposed, developed and etched so as to form patterns of the gate lines 10, the gates 11 and the common electrode lines 20;

Step 2: a gate insulation layer, such as a silicon nitride layer is deposited by a Plasma Enhanced Chemical Vapor Deposition (PECVD) process.

Step 3: a semiconductor layer, such as an amorphous silicon (a-Si) layer, is deposited by a Plasma Enhanced Chemical Vapor Deposition (PECVD) process; alternatively, an oxide semiconductor (IGZO) layer is deposited by a sputtering process; and then, the semiconductor layer is coated with photoresist, and is exposed, developed and etched so as to form a pattern of the active layer;

Step 4: after the step 3, a metal layer, such as an Al layer is deposited by a sputtering deposition process, and then, the metal layer is coated with photoresist, and is exposed, developed and etched to form patterns of the data lines 30, the sources 31 and the drains 32;

Step 5: a passivation layer, such as a silicon nitride layer, is deposited by a PECVD process, or a resin layer is coated by a coating method; then, the passivation layer is coated with photoresist, and is exposed, developed and etched so as to form first via holes 35 and second via holes 36; the drains of the thin film transistors are exposed from the first via holes 35, and the common electrode lines are exposed from the second via holes 36;

Step 6: an electrically conductive transparent layer of a metal oxide such as ITO is formed by sputtering, and the electrically conductive transparent layer is coated with photoresist, and is exposed, developed and etched so as to form patterns of the pixel electrodes 42 and the shielding electrodes 41; the pixel electrodes 42 are electrically connected with the drains of the thin film transistors by the first via holes 35; the shielding electrodes 41 are electrically connected with the common electrode lines 20 by the second via holes 36; and the shielding electrodes 41 are disposed above the gate lines 10 and the data lines 30.

Embodiments of the present invention have been described above by taking, for instance, an arrangement in which the common electrode lines are provided on the array substrate and are located in the same layer as the gate lines. In variants of the above embodiments, the common electrode lines and the pixel electrodes are located in the same layer or in different layers above the array substrate, and other arrangements are similar to those described in the above embodiments and shown in figures. When the common electrode lines are provided on the array substrate, a display mode for the display device comprises at least ADS, IPS, VA-IPS, or the like, which are not described here.

Embodiments of the present invention further provide a display device comprising the array substrate as described above. Since the array substrate is provided with shielding electrodes thereon, when images are displayed by the display device comprising the array substrate, voltages on the pixel electrodes will not be interfered by gate line signals and data line signals, thereby achieving a better display effect of images. The display device may be a display device in a mode such as TN, ADS, IPS, VA-IPS or the like.

Concerning the above, embodiments of the present invention provide an array substrate, comprising gate lines and data lines disposed on a substrate, and pixel units surrounded and separated by the gate lines and the data lines, and further comprising shielding electrodes disposed above at least one of the gate lines and the data lines to cover at least part of the at least one of the gate lines and data lines and electrically insulated from the gate lines and the data lines. The shielding electrodes can eliminate the interference of the transient electromagnetic signals on the voltages on the pixel electrodes, thereby improving the image display quality, the transient electromagnetic signals being caused by the time-varying voltages on the gate lines and the data lines.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

What is claimed is:

1. An array substrate comprising:
   common electrode lines, gate lines, and data lines disposed on a substrate;

pixel units surrounded and separated by the gate lines and the data lines; and shielding electrodes, disposed above the gate lines to cover the gate lines, or shielding electrodes, disposed above the gate lines and the data lines to cover the gate lines and the data lines, wherein the shielding electrodes are electrically insulated from the gate lines and the data lines;

wherein the shielding electrodes are electrically connected with the common electrode lines;

wherein the common electrode lines and the shielding electrodes are disposed in different layers and are electrically connected with each other through via holes; and wherein one via hole is provided for every two or more pixel electrodes.

2. The array substrate according to claim 1, wherein the shielding electrodes and the common electrode lines are at least partially overlapped with each other in a direction perpendicular to the array substrate.

3. The array substrate according to claim 1, wherein the common electrode lines and the gate lines are located in the same layer.

4. The array substrate according to claim 3, wherein the gate lines and the common electrode lines are made of the same material.

5. The array substrate according to claim 1, wherein the respective via holes are disposed at the same positions of one of the respective two or more pixel electrodes.

6. The array substrate according to claim 1, wherein the pixel electrodes are disposed above the substrate and located in the same layer as the shielding electrodes.

7. The array substrate according to claim 6, wherein the pixel electrodes and the shielding electrodes are transparent conductive electrodes made of the same material.

8. The array substrate according to claim 1, wherein the gate lines, the common electrode lines and the data lines are made of metal or alloy.

9. The array substrate according to claim 1, further comprising thin film transistors disposed at crossed regions between the gate lines and the data lines, wherein the shielding electrodes are further disposed above and cover the thin film transistors.

10. A display device, comprising the array substrate according claim 1.

* * * * *